(12) United States Patent
Wang et al.

(10) Patent No.: US 8,774,249 B2
(45) Date of Patent: Jul. 8, 2014

(54) SPREAD-SPECTRUM CLOCK ACQUISITION AND TRACKING

(75) Inventors: Gang Wang, Shanghai (CN); Wei Zhou, San Jose, CA (US); Chee Hoe Chu, San Jose, CA (US); Po-Chien Chang, Saratoga, CA (US)

(73) Assignee: Marvell World Trade Ltd., St. Michael (BB)

( * ) Notice: Subject to any disclaimer, the term of this patent is extended or adjusted under 35 U.S.C. 154(b) by 885 days.

(21) Appl. No.: 12/878,634

(22) Filed: Sep. 9, 2010

(65) Prior Publication Data

US 2011/0068836 A1  Mar. 24, 2011

Related U.S. Application Data

(60) Provisional application No. 61/245,226, filed on Sep. 23, 2009.

(51) Int. Cl.
*H04B 1/00* (2006.01)

(52) U.S. Cl.
USPC ........... 375/130; 375/136; 375/147; 375/316

(58) Field of Classification Search
USPC .............. 375/130, 147, 316, 324, 340, 355
See application file for complete search history.

(56) References Cited

U.S. PATENT DOCUMENTS

| | | | | |
|---|---|---|---|---|
| 7,295,644 B1 * | 11/2007 | Wu et al. | | 375/375 |
| 7,738,617 B1 * | 6/2010 | Fortin et al. | | 375/373 |
| 8,139,702 B1 * | 3/2012 | Fortin et al. | | 375/373 |

* cited by examiner

*Primary Examiner* — Ted Wang

(57) ABSTRACT

Apparatus having corresponding methods and computer-readable media comprise: a phase detector configured to generate an error signal representing a phase difference between a recovered spread-spectrum clock signal and a serial data stream that includes a spread-spectrum clock signal; and a phase selector configured to provide the recovered spread-spectrum clock signal based on an error signal from a current spread-spectrum cycle of the spread-spectrum clock signal and an error signal from a previous spread-spectrum cycle of the spread-spectrum clock signal.

18 Claims, 9 Drawing Sheets

SPREAD-SPECTRUM CLOCK ACQUISITION AND TRACKING

CROSS-REFERENCE TO RELATED APPLICATIONS

This disclosure claims the benefit of U.S. Provisional Patent Application Ser. No. 61/245,226, filed on Sep. 23, 2009, the disclosure thereof incorporated by reference herein in its entirety.

FIELD

The present disclosure relates generally to use of spread-spectrum clocking. More particularly, the present disclosure relates to acquisition and tracking of spread-spectrum clocks embedded in serial data streams.

BACKGROUND

Spread-spectrum clocking has emerged as a cost-effective technique for reducing the spectral density of electromagnetic interference (EMI) generated by synchronous communications systems. With a regular clock, the EMI is concentrated near the frequency of the clock. Spread-spectrum clocking varies the frequency or phase of the clock, thereby spreading the EMI over a broader spectrum. Spread-spectrum clocking is used in many areas, for example in serial communications having an embedded clock signal.

Acquiring and tracking such a clock signal can be difficult. Failure to track the clock signal results in unacceptably high bit error rates. One common remedy is to keep the spreading of the clock signal at the transmitter within a narrow range to facilitate clock recovery at the receiver. Of course, this limits the efficacy of the spreading in reducing EMI.

SUMMARY

In general, in one aspect, an embodiment features an apparatus comprising: a phase detector configured to generate an error signal representing a phase difference between a recovered spread-spectrum clock signal and a serial data stream that includes a spread-spectrum clock signal; and a phase selector configured to provide the recovered spread-spectrum clock signal based on an error signal from a current spread-spectrum cycle of the spread-spectrum clock signal and an error signal from a previous spread-spectrum cycle of the spread-spectrum clock signal.

Embodiments of the apparatus can include one or more of the following features. Some embodiments comprise a memory having a plurality of locations each configured to store a respective sum of a sample of the error signal from the current spread-spectrum cycle of the spread-spectrum clock signal and a corresponding sample of the error signal from the previous spread-spectrum cycle of the spread-spectrum clock signal; wherein the phase selector is further configured to provide the recovered spread-spectrum clock signal based on the sums. In some embodiments, the memory comprises: a chain of D-flip-flops each configured to provide one of the locations of the memory. Some embodiments comprise an adder configured to provide the sums. Some embodiments comprise an interpolator configured to interpolate the samples prior to the adder providing the sums. Some embodiments comprise a loop filter configured to filter the error signal generated by the phase detector according to one or more loop parameters. Some embodiments comprise a controller configured to provide the one or more loop parameters, wherein the loop controller provides a first set of loop parameters to acquire the spread-spectrum clock signal and a second set of loop parameters to track the spread-spectrum clock signal. Some embodiments comprise a receiver comprising: the apparatus and a deserializer configured to recover data from the serial data stream based on the recovered spread-spectrum clock signal. Some embodiments comprise a communication device comprising the receiver.

In general, in one aspect, an embodiment features a method comprising: generating an error signal representing a phase difference between a recovered spread-spectrum clock signal and a serial data stream that includes a spread-spectrum clock signal; and providing the recovered spread-spectrum clock signal based on an error signal from a current spread-spectrum cycle of the spread-spectrum clock signal and an error signal from a previous spread-spectrum cycle of the spread-spectrum clock signal.

Embodiments of the method can include one or more of the following features. Some embodiments comprise generating a plurality of sums, wherein each of the sums represents a sum of a respective sample of the error signal from the current spread-spectrum cycle of the spread-spectrum clock signal and a corresponding sample of the error signal from the previous spread-spectrum cycle of the spread-spectrum clock signal; and providing the recovered spread-spectrum clock signal based on the sums. Some embodiments comprise filtering the generated error signal according to one or more loop parameters. Some embodiments comprise providing a first set of loop parameters for acquiring the spread-spectrum clock signal; and providing a second set of loop parameters for tracking the spread-spectrum clock signal. Some embodiments comprise recovering data from the serial data stream based on the recovered spread-spectrum clock signal.

In general, in one aspect, an embodiment features computer-readable media embodying instructions executable by a computer to perform a method comprising: generating an error signal representing a phase difference between a recovered spread-spectrum clock signal and a serial data stream that includes a spread-spectrum clock signal; and providing the recovered spread-spectrum clock signal based on an error signal from a current spread-spectrum cycle of the spread-spectrum clock signal and an error signal from a previous spread-spectrum cycle of the spread-spectrum clock signal.

Embodiments of the computer-readable media can include one or more of the following features. In some embodiments, the method further comprises: generating a plurality of sums, wherein each of the sums represents a sum of a respective sample of the error signal from the current spread-spectrum cycle of the spread-spectrum clock signal and a corresponding sample of the error signal from the previous spread-spectrum cycle of the spread-spectrum clock signal; and providing the recovered spread-spectrum clock signal based on the sums. In some embodiments, the method further comprises: filtering the generated error signal according to one or more loop parameters. In some embodiments, the method further comprises: providing a first set of loop parameters for acquiring the spread-spectrum clock signal; and providing a second set of loop parameters for tracking the spread-spectrum clock signal. In some embodiments, the method further comprises: recovering data from the serial data stream based on the recovered spread-spectrum clock signal.

The details of one or more implementations are set forth in the accompanying drawings and the description below. Other features will be apparent from the description and drawings, and from the claims.

Figure 1:
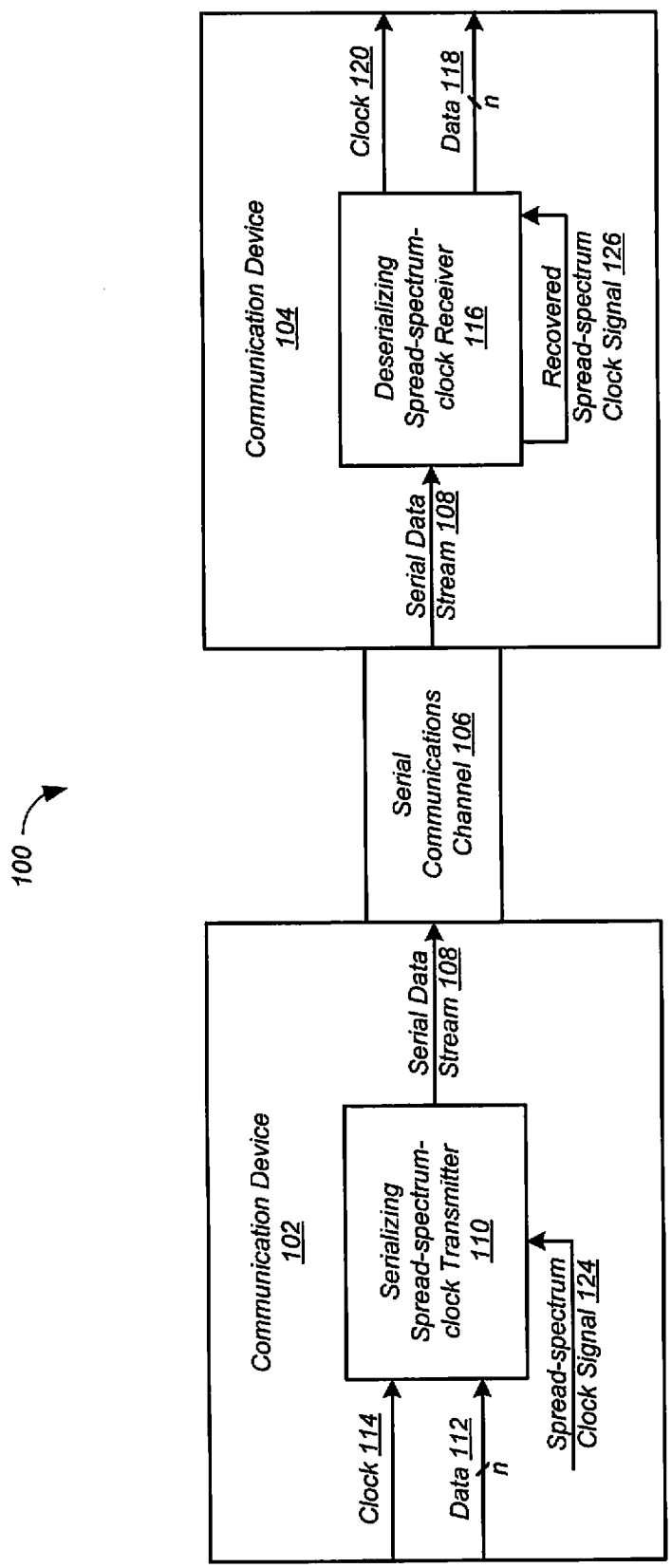
FIG. 1 shows elements of a data communication system according to one embodiment.

The leading digit(s) of each reference numeral used in this specification indicates the number of the drawing in which the reference numeral first appears.

DETAILED DESCRIPTION

The subject matter of the present disclosure relates to acquisition and tracking of spread-spectrum clocks embedded in serial data streams. Various embodiments are described in the context of gigabit SERDES (serializer/deserializer). However, the disclosed techniques are applicable to other types of communications systems and data rates. According to the disclosed embodiments, a clock detection and recovery unit records phase errors during each spread-spectrum cycle of the spread-spectrum clock, and employs the recorded errors in subsequent cycles to achieve dramatically improved acquisition and tracking of spread-spectrum clocks. This improvement permits the use of larger spread-spectrum clock ranges, resulting in reduced EMI.

FIG. 1 shows elements of a data communication system 100 according to one embodiment. Although in the described embodiments the elements of data communication system 100 are presented in one arrangement, other embodiments may feature other arrangements. For example, elements of data communication system 100 can be implemented in hardware, software, or combinations thereof.

Referring to FIG. 1, data communication system 100 includes a first communication device 102 transmitting a serial data stream 108 to a second communication device 104 over a serial communications channel 106. Serial data stream 108 has an embedded clock signal. For example, serial data stream 108 can be a gigabit SERDES data stream or the like.

Communication device 102 includes a serializing spread-spectrum-clock transmitter 110. Serializing transmitter 110 receives n-bit parallel data 112 and a clock signal 114, and serializes the data according to a spread-spectrum clock signal 124 to produce a serial data stream 108 having embedded spread-spectrum clock signal 124. Transmitter 110 transmits serial data stream 108 over serial communications channel 106.

Communication device 104 includes a deserializing spread-spectrum-clock receiver 116. Deserializing receiver 116 receives serial data stream 108 over serial communications channel 106, recovers embedded spread-spectrum clock signal 124 as recovered spread-spectrum clock signal 126, and outputs n-bit parallel data 118 and a clock signal 120 based on serial data stream 108 and recovered spread-spectrum clock signal 126.

Figure 2:
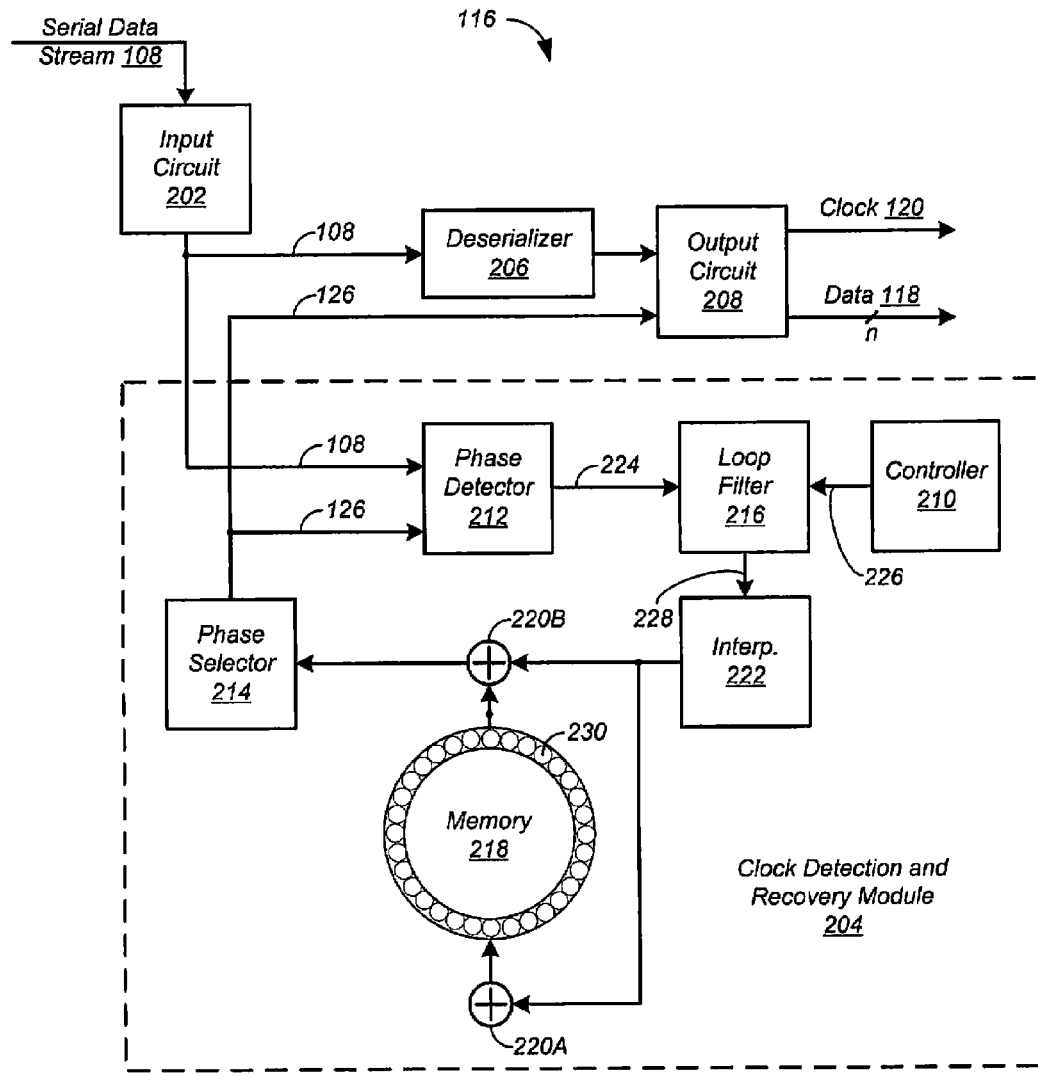
FIG. 2 shows elements of the deserializing receiver of FIG. 1 according to one embodiment.

FIG. 2 shows elements of deserializing receiver 116 of FIG. 1 according to one embodiment. Although in the described embodiments the elements of deserializing receiver 116 are presented in one arrangement, other embodiments may feature other arrangements. For example, elements of deserializing receiver 116 can be implemented in hardware, software, or combinations thereof.

Referring to FIG. 2, deserializing receiver 116 includes an input circuit 202, a clock detection and recovery (CDR) module 204, a deserializer 206, and an output circuit 208. CDR module 204 includes a controller 210, a phase detector 212, a phase selector 214, a loop filter 216, a memory 218, and adders 220A and 220B. CDR module 204 can also include an interpolator 222. Phase detector 212 can be implemented as a bang-bang-type phase detector. Phase selector 214 can be implemented as an oscillator with multi-phase outputs.

Figure 3:
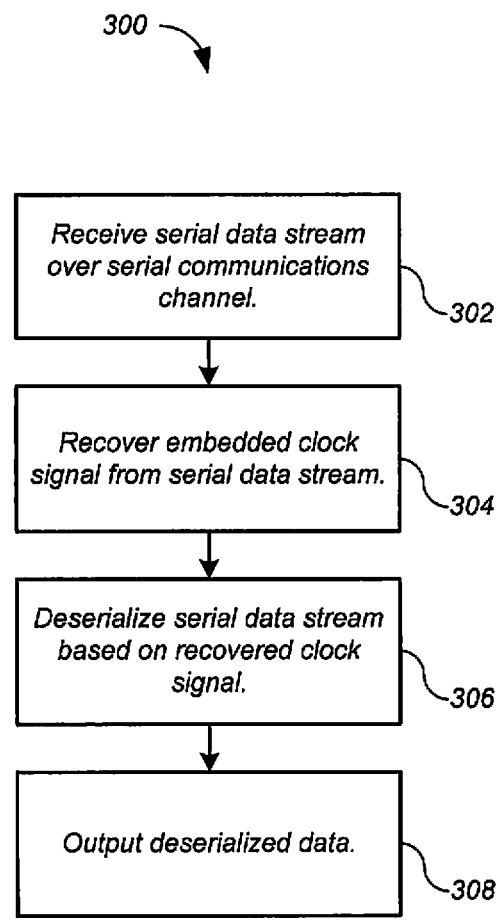
FIG. 3 shows a process operated by the deserializing receiver of FIG. 2 according to one embodiment.

FIG. 3 shows a process 300 operated by deserializing receiver 116 of FIG. 2 according to one embodiment. Although in the described embodiments the elements of process 300 are presented in one arrangement, other embodiments may feature other arrangements. For example, in various embodiments, some or all of the steps of process 300 can be executed in a different order, concurrently, and the like.

Referring to FIGS. 2 and 3, at 302 input circuit 202 receives serial data stream 108 over serial communications channel 106. At 304, CDR module 204 recovers the embedded clock signal from serial data stream 108 as recovered spread-spectrum clock signal 126. At 306, deserializer 206 deserializes serial data stream 108 based on recovered spread-spectrum clock signal 126, producing n-bit parallel data 118. At 308, output circuit 208 outputs deserialized n-bit parallel data 118 and clock signal 120.

Figure 4:
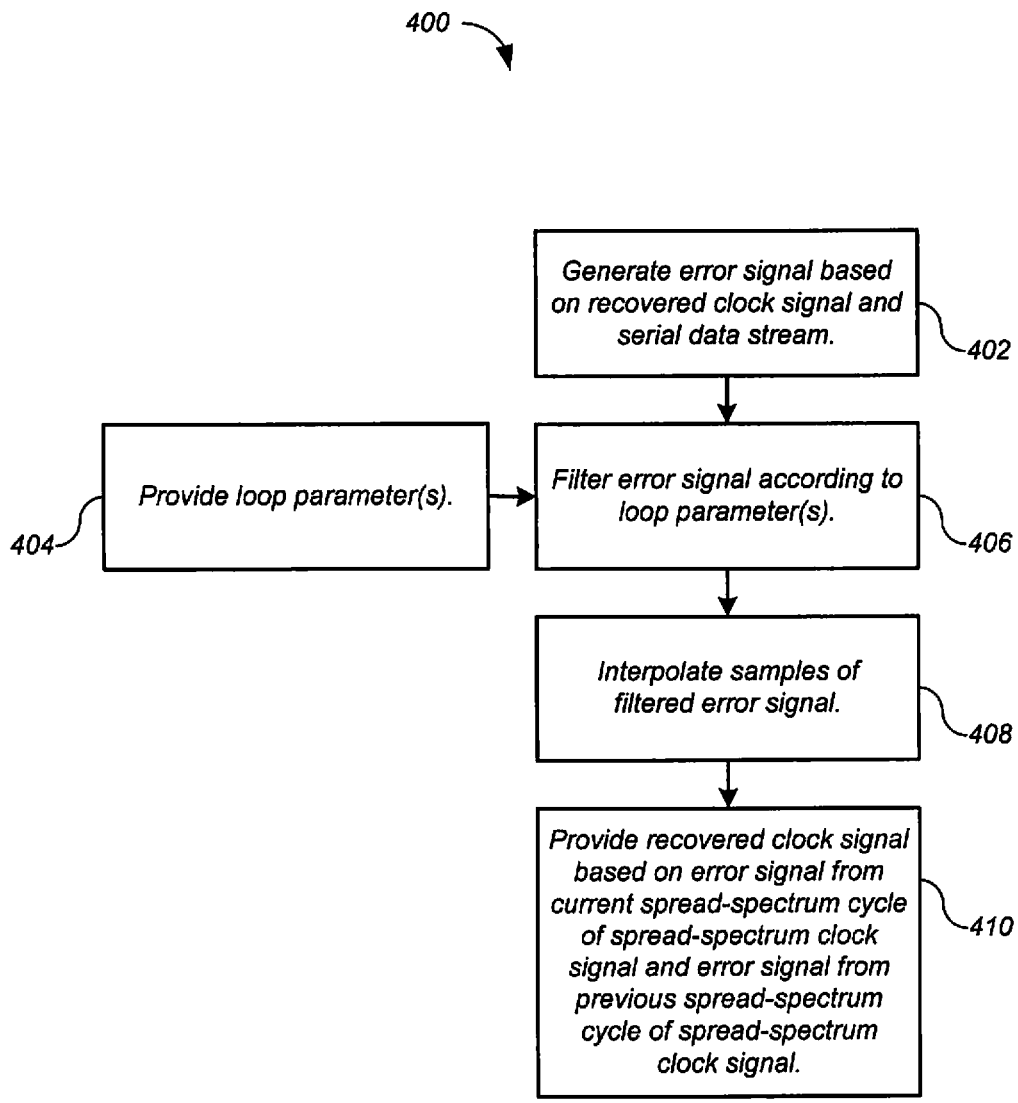
FIG. 4 shows a process operated by the CDR module of FIG. 2 according to one embodiment.

FIG. 4 shows a process 400 operated by CDR module 204 of FIG. 2 according to one embodiment. Although in the described embodiments the elements of process 400 are presented in one arrangement, other embodiments may feature other arrangements. For example, in various embodiments, some or all of the steps of process 400 can be executed in a different order, concurrently, and the like.

Referring to FIGS. 2 and 4, at 402 phase detector 212 generates an error signal 224 based on recovered spread-spectrum clock signal 126 and serial data stream 108. Error signal 224 represents a phase difference between recovered spread-spectrum clock signal 126 and serial data stream 108.

At 404 controller 210 provides one or more loop parameters 226 to loop filter 216. Controller 210 provides a first set of loop parameters 226 to acquire the spread-spectrum clock signal embedded in serial data stream 108, and a second set of loop parameters 226 to track the spread-spectrum clock signal, as described in greater detail below. At 406 loop filter 216 filters error signal 224 according to loop parameters 226, thereby producing filtered error signal 228. The sampling rate of filtered error signal 228 may differ from the sampling rate of the error samples stored in memory 218. If the sampling rates differ, at 408 interpolator 222 interpolates the samples of filtered error signal 228 accordingly. If the sampling rates are the same, interpolator 222 is not needed.

Figure 5:
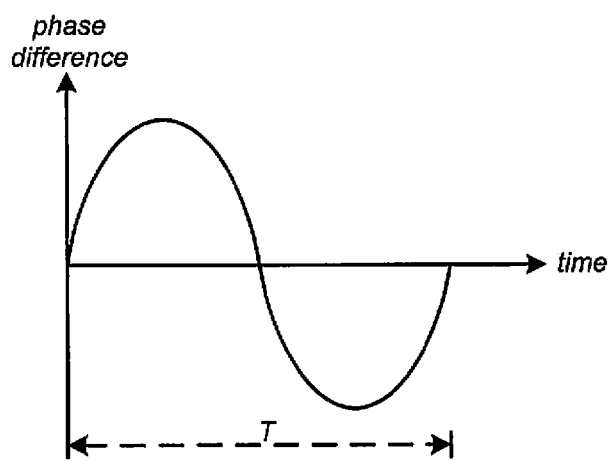
FIG. 5 shows a plot of an example spread-spectrum cycle of a spread-spectrum clock signal.

At 410, phase selector 214 provides recovered spread-spectrum clock signal 126 based on the error signal 224 from a current spread-spectrum cycle of spread-spectrum clock signal 124 and the error signal 224 from a previous spread-spectrum cycle of spread-spectrum clock signal 124. The term "spread-spectrum cycle" is used herein to refer to a cycle of clock spreading, as opposed to an individual clock cycle of clock signal 124. FIG. 5 shows a plot of an example spread-spectrum cycle of a spread-spectrum clock signal. In the example of FIG. 5, the spread-spectrum cycle is a periodic sinusoid when plotted as a graph of phase difference vs. time. The duration of the spread-spectrum cycle is shown in FIG. 5 as period T.

Returning to FIG. 2, memory 218 has a plurality of locations 230. Each location 230 is used to store a respective sum of a sample of error signal 224 from a current spread-spectrum cycle of spread-spectrum clock signal 124 and a corresponding sample of error signal 224 from a previous spread-spectrum cycle of spread-spectrum clock signal 124. Adder 220A provides the sums to memory 218. Adder 220B provides the sums to phase selector 214. Phase selector 214 provides recovered spread-spectrum clock signal 126 based on the sums.

Figure 6:
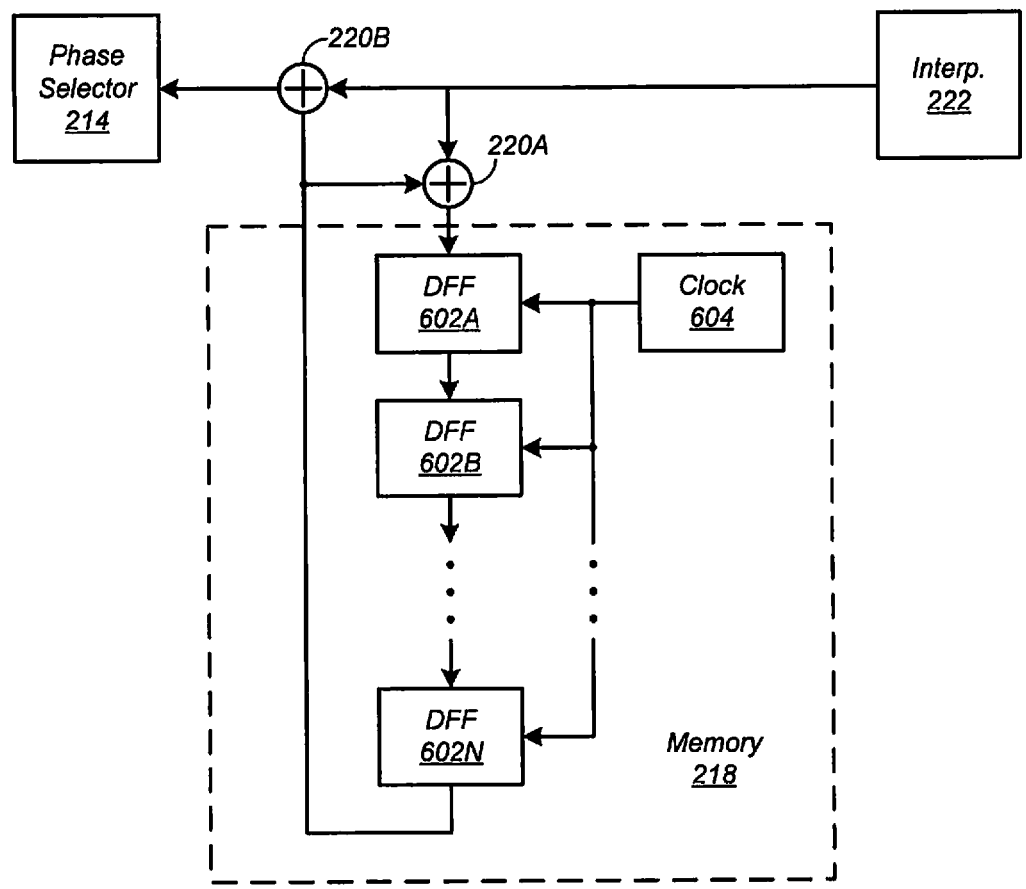
FIG. 6 shows detail of the memory of FIG. 2 according to one embodiment.

Memory 218 is configured as a memory barrel having a number of locations 230 equal to the number of samples of error signal 224 taken during a single spread-spectrum cycle of spread-spectrum clock signal 124. For example, according to one embodiment, memory 218 has 48 locations. Of course, other numbers of samples and locations can be used instead. FIG. 6 shows detail of memory 218 according to one embodiment. Referring to FIG. 6, memory 218 is implemented as a chain of D-flip-flops (DFF) 602A-602N clocked by a common clock 604. Each D-flip-flop 602 provides one of the locations 230 of memory 218.

Figure 7:
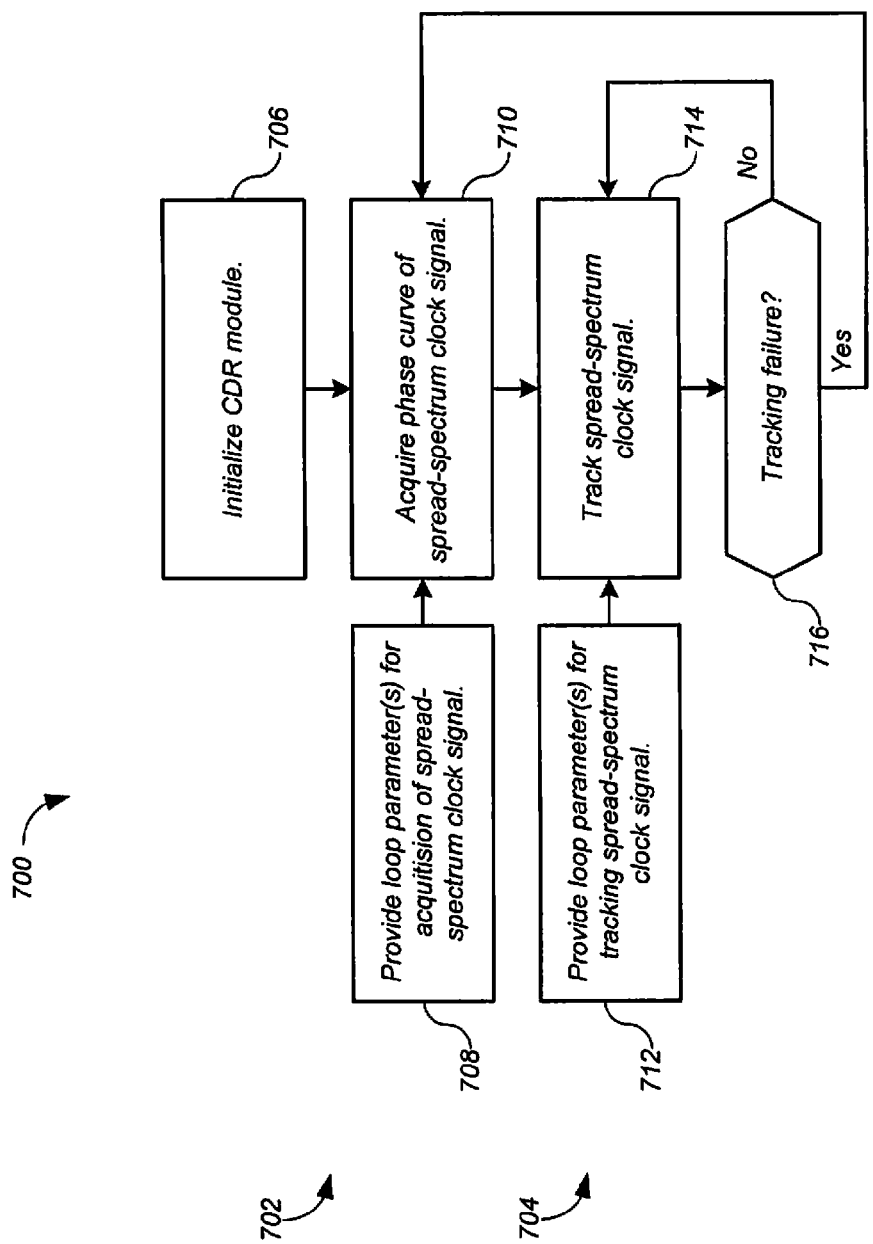
FIG. 7 shows a process operated by the CDR module of FIG. 2 in acquiring and tracking a spread-spectrum clock signal according to one embodiment.

FIG. 7 shows a process 700 operated by CDR module 204 of FIG. 2 in acquiring and tracking spread-spectrum clock signal 124 according to one embodiment. Although in the described embodiments the elements of process 700 are presented in one arrangement, other embodiments may feature other arrangements. For example, in various embodiments, some or all of the steps of process 700 can be executed in a different order, concurrently, and the like.

Referring to FIG. 7, acquisition operations are shown at 702, while tracking operations are shown at 704. In some cases, when the spread-spectrum clock range is sufficiently narrow, acquisition operations 702 are unnecessary, and process 700 can begin with tracking operations 704. Now process 700 is described, beginning with acquisition operations 702.

At 706 CDR module 204 is initialized, for example by applying power, clearing locations 230 in memory 218, and the like. At 708 controller 210 provides a set of loop parameters 226 that is selected for acquisition of spread-spectrum clock signal 124. Loop parameters 226 can include parameters such as gain, bandwidth, latency, and the like. Loop parameters 226 selected for acquisition can differ from loop parameters 226 selected for tracking, for example by specifying greater bandwidth and the like. Loop filter 216 receives loop parameters 226 and operates accordingly.

At 710, CDR module 204 acquires spread-spectrum clock signal 124. During an initial spread-spectrum cycle of spread-spectrum clock signal 124, CDR module 204 acquires the phase curve of spread-spectrum clock signal 124, which is stored in memory 218. During subsequent spread-spectrum cycles, CDR module 204 acquires spread-spectrum clock signal 124. At 712, after CDR module 204 has acquired spread-spectrum clock signal 124, controller 210 provides a set of loop parameters 226 that is selected for tracking spread-spectrum clock signal 124. Loop filter 216 receives loop parameters 226 and operates accordingly. At 714, CDR module 204 is tracking spread-spectrum clock signal 124. At 716, if at any time CDR module 204 fails to track spread-spectrum clock signal 124, process 700 can return to acquisition operations 702.

FIGS. 8-11 demonstrate the operation of the described embodiments where the transmitter and receiver experience a frequency shift. In addition, the spread-spectrum clock range is gradually increased at the transmitter. The nominal frequency of the transmitter spread-spectrum clock is 29.5 kHz, while the nominal frequency of the receiver clock is 30 kHz.

Figure 8:
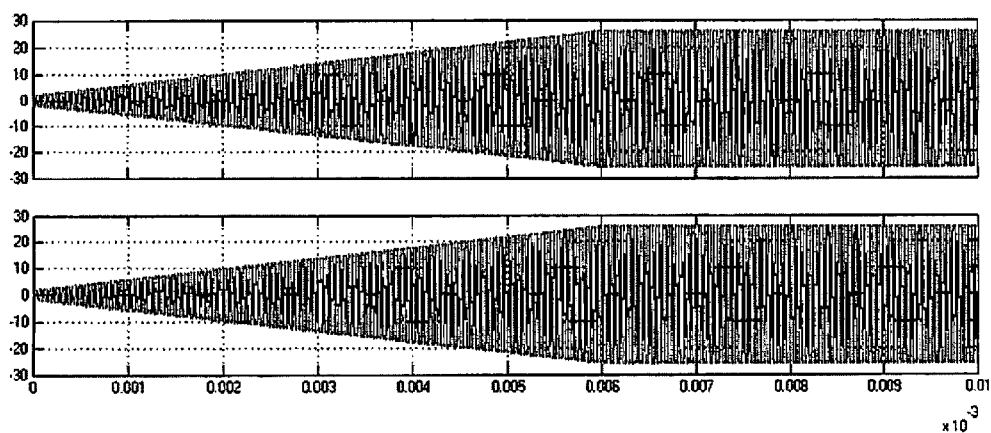
FIG. 8 shows two plots of clock phase vs. time.
Figure 9:
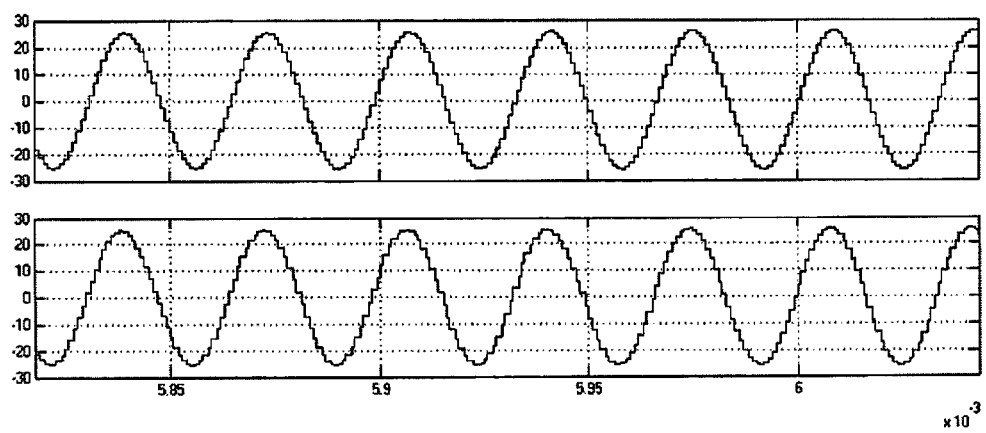
FIG. 9 shows an enlarged portion of the plots of FIG. 8.

FIG. 8 shows two plots of clock phase vs. time. The upper plot represents the transmitter clock, while the lower plot represents the receiver clock. FIG. 9 shows an enlarged portion of the plots of FIG. 8. From a comparison of the plots, it is clear that the waveforms match well, indicating good clock tracking.

Figure 10:
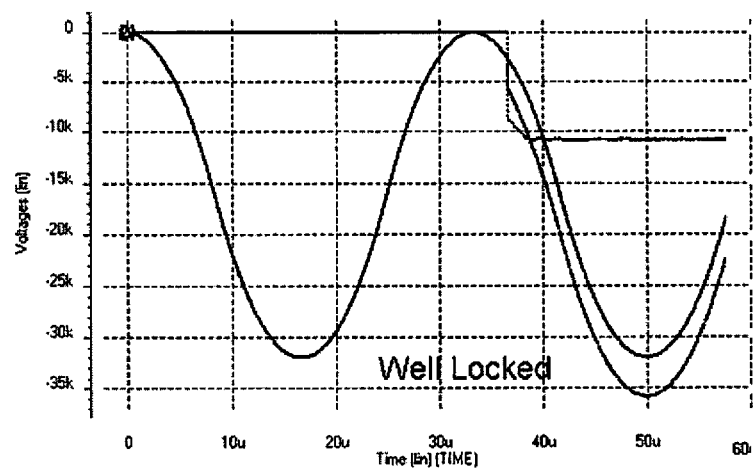
FIG. 10 shows a plot of clock phase (represented by a voltage) vs. time.

FIG. 10 shows a plot of clock phase (represented by a voltage) vs. time. The transition from acquisition to tracking is apparent at t=33 microseconds.

Figure 11:
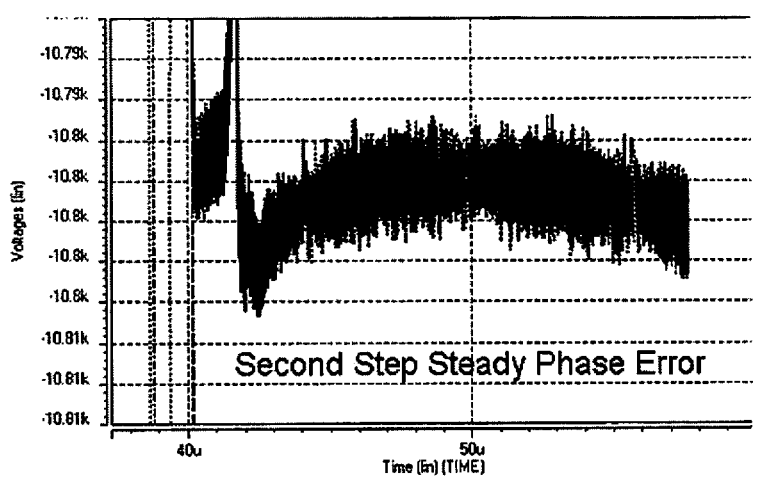
FIG. 11 shows a plot of clock phase error (represented by a voltage) vs. time.

FIG. 11 shows a plot of clock phase error (represented by a voltage) vs. time. The error clearly remains within a small, limited range.

Various embodiments can be implemented in digital electronic circuitry, or in computer hardware, firmware, software, or in combinations of them. Embodiments can be implemented in a computer program product tangibly embodied in a machine-readable storage device for execution by a programmable processor; and method steps can be performed by a programmable processor executing a program of instructions to perform functions by operating on input data and generating output. Embodiments can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An apparatus comprising:
a phase detector configured to generate an error signal representing a phase difference between
(i) a recovered clock signal, and
(ii) a serial data stream, wherein the serial data stream includes a first clock signal, and wherein a frequency and a phase of the first clock signal vary; and
a phase selector configured to provide the recovered clock signal based on (i) a first sample of the error signal for a first cycle of the first clock signal, and (ii) a second sample of the error signal for a second cycle of the first clock signal,
wherein
the phase selector is configured to provide the recovered clock signal based on (i) a first sum of a first plurality of samples of the error signal for first consecutive cycles of the first clock signal, and (ii) a second sum of a second plurality of samples of the error signal for second consecutive cycles of the first clock signal, and the first plurality of samples include the first sample and the second sample.

2. An apparatus comprising:
a phase detector configured to generate an error signal representing a phase difference between
   (i) a recovered clock signal, and
   (ii) a serial data stream that includes a spread-spectrum clock signal;
a phase selector configured to provide the recovered clock signal based on (i) the error signal for a current spread-spectrum cycle of the spread-spectrum clock signal, and (ii) the error signal for a previous spread-spectrum cycle of the spread-spectrum clock signal; and
a memory having a plurality of locations each configured to store a respective sum of
   (i) a sample of the error signal from the current spread-spectrum cycle of the spread-spectrum clock signal, and
   (ii) a corresponding sample of the error signal from the previous spread-spectrum cycle of the spread-spectrum clock signal,
wherein the phase selector is further configured to provide the recovered clock signal based on the sums.

3. The apparatus of claim 2, wherein the memory comprises a chain of D-flip-flops each configured to provide one of the locations of the memory.

4. The apparatus of claim 2, further comprising an adder configured to provide the sums.

5. The apparatus of claim 4, further comprising an interpolator configured to interpolate the samples prior to the adder providing the sums.

6. The apparatus of claim 2, further comprising a loop filter configured to filter the error signal generated by the phase detector according to one or more loop parameters.

7. An apparatus comprising:
a phase detector configured to generate an error signal representing a phase difference between
   (i) a recovered clock signal, and
   (ii) a serial data stream that includes a spread-spectrum clock signal;
a phase selector configured to provide the recovered clock signal based on (i) the error signal for a current spread-spectrum cycle of the spread-spectrum clock signal and (ii) the error signal for a previous spread-spectrum cycle of the spread-spectrum clock signal;
a loop filter configured to filter the error signal generated by the phase detector according to one or more loop parameters; and
a controller configured to provide the one or more loop parameters, wherein the controller provides a first set of loop parameters to acquire the spread-spectrum clock signal and a second set of loop parameters to track the spread-spectrum clock signal.

8. A receiver comprising:
the apparatus of claim 2; and
a deserializer configured to recover data from the serial data stream based on the recovered clock signal.

9. A communication device comprising the receiver of claim 8.

10. A method comprising:
via a phase detector, generating an error signal representing a phase difference between
   (i) a recovered clock signal, and
   (ii) a serial data stream, wherein the serial data stream includes a first clock signal, and, wherein a frequency and a phase of the first clock signal vary;
providing the recovered clock signal based on (i) a first sample of the error signal for a first cycle of the first clock signal, and (ii) a second sample of the error signal for a second cycle of the first clock signal;
summing a first plurality of samples of the error signal for first consecutive cycles of the first clock signal to generate a first sum, wherein the first plurality of samples include the first sample and the second sample; and
summing a second plurality of samples of the error signal for second consecutive cycles of the first clock signal to generate a second sum,
wherein the recovered clock signal is provided based on the first sum and the second sum.

11. A method comprising:
generating an error signal representing a phase difference between
   (i) a recovered clock signal, and
   (ii) a serial data stream that includes a spread-spectrum clock signal;
providing the recovered clock signal based on (i) an error signal from a current spread-spectrum cycle of the spread-spectrum clock signal, and (ii) an error signal from a previous spread-spectrum cycle of the spread-spectrum clock signal;
generating a plurality of sums, wherein each of the sums represents a sum of
   (i) a respective sample of the error signal from the current spread-spectrum cycle of the spread-spectrum clock signal and
   (ii) a corresponding sample of the error signal from the previous spread-spectrum cycle of the spread-spectrum clock signal; and
providing the recovered clock signal based on the plurality of sums.

12. The method of claim 11, further comprising filtering the error signal according to one or more loop parameters.

13. The method of claim 12, further comprising:
providing a first set of loop parameters for acquiring the spread-spectrum clock signal; and
providing a second set of loop parameters for tracking the spread-spectrum clock signal.

14. The method of claim 11, further comprising recovering data from the serial data stream based on the recovered clock signal.

15. A non-transitory computer-readable medium embodying instructions executable by a computer, wherein the instructions comprise:
generating an error signal representing a phase difference between
   (i) a recovered clock signal, and
   (ii) a serial data stream that includes a spread-spectrum clock signal;
providing the recovered clock signal based on (i) the error signal for a current spread-spectrum cycle of the spread-spectrum clock signal, and (ii) the error signal for a previous spread-spectrum cycle of the spread-spectrum clock signal;
generating a plurality of sums, wherein each of the sums represents a sum of
   (i) a respective sample of the error signal from the current spread-spectrum cycle of the spread-spectrum clock signal, and (ii) a corresponding sample of the error signal from the previous spread-spectrum cycle of the spread-spectrum clock signal; and providing the recovered clock signal based on the plurality of sums.

16. The non-transitory computer-readable medium of claim 15, wherein the instructions further comprise filtering the generated error signal according to one or more loop parameters.

17. The non-transitory computer-readable medium of claim 16, wherein the instructions further comprise:

providing a first set of loop parameters for acquiring the spread-spectrum clock signal; and providing a second set of loop parameters for tracking the spread-spectrum clock signal.

18. The non-transitory computer-readable medium of claim 15, wherein the instructions further comprise recovering data from the serial data stream based on the recovered clock signal.

* * * * *